(12) United States Patent
Vines et al.

(10) Patent No.: US 6,429,144 B1
(45) Date of Patent: Aug. 6, 2002

(54) INTEGRATED CIRCUIT MANUFACTURE METHOD WITH AQUEOUS HYDROGEN FLUORIDE AND NITRIC ACID OXIDE ETCH

(75) Inventors: Landon B. Vines, San Antonio, TX (US); Felix H. Fujishiro, San Jose, CA (US); Yu-Pin Han, Dallas, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/473,451

(22) Filed: Dec. 28, 1999

(51) Int. Cl.$^7$ .......................................... H01L 21/302
(52) U.S. Cl. ................. 438/745; 438/750; 438/753; 438/756; 134/1.1; 134/1.2
(58) Field of Search ................. 438/745, 750, 438/756, 753; 134/1.1, 1.2, 1.3; 252/79.1, 79.2

(56) References Cited

U.S. PATENT DOCUMENTS

| | | | |
|---|---|---|---|
| 5,190,792 A | * 3/1993 | Blum et al. | 427/560 |
| 5,489,557 A | * 2/1996 | Jolley | 156/345 |
| 5,504,022 A | * 4/1996 | Nakanishi et al. | 438/14 |
| 5,783,790 A | * 7/1998 | Mitsumori et al. | 204/157.15 |
| 5,849,603 A | * 12/1998 | Kato et al. | 438/14 |
| 5,919,311 A | * 7/1999 | Shive et al. | 134/1 |
| 6,178,972 B1 | * 1/2001 | Harada et al. | 134/1.3 |

* cited by examiner

Primary Examiner—Robert Kunemund
Assistant Examiner—Lan Vinh
(74) Attorney, Agent, or Firm—Peter Zawilski

(57) ABSTRACT

In the manufacture of an integrated circuit, contaminated oxide is replaced by relatively pure oxide using the following steps. First, a partially manufactured integrated circuit is bathed in an aqueous solution of hydrogen peroxide and ammonium hydroxide to oxidize organic materials and weaken bonds of metal contaminants to the integrated circuit substrate. Second, an aqueous rinse removes the oxidized organic materials and metal contaminants. Third, the integrated circuit is bathed in an aqueous solution of hydrogen fluoride and nitric acid. The hydrogen fluroide etches the contaminated oxide; the nitric acid combines with calcium and metal contaminants freed as the oxide is etched. The resulting nitride byproducts are highly soluble and easily removed in the following aqueous rinse. A drying step removes rinse water from the integrated circuit. Finally, an oxide formation step provides a relatively pure oxide layer. In the case of a gate oxide, the method removes a sacrificial oxide in preparation for gate oxide growth. In the case of formation of the submetal dielectric, oxide formation involves an TEOS oxide deposition. A key advantage of the invention is the improved calcium removal due to the nitric acid.

13 Claims, 4 Drawing Sheets

US 6,429,144 B1

INTEGRATED CIRCUIT MANUFACTURE METHOD WITH AQUEOUS HYDROGEN FLUORIDE AND NITRIC ACID OXIDE ETCH

BACKGROUND OF THE INVENTION

The present invention relates to integrated circuit manufacturing and, more particularly, to oxide formations and pre-cleans therefor. A major objective of the present invention is to provide for more reliable and longer-lasting gate oxides.

Progress in integrated circuit manufacture is generally associated with reductions in feature sizes; in fact, such progress can be roughly quantified as the minimum feature width definable by a given process technology. The features of interest are electrically active elements defined in a semiconductor substrate and conductive elements that provide access to and interconnection between the active elements. The minimum feature width for some of the earliest integrated circuits was a few microns; over the years, feature widths have dropped an order of magnitude. Reductions in feature width have allowed integrated circuit devices to be arranged closer together, providing greater functional density and higher operating speeds. Feature thickness has diminished along with feature width, although not as dramatically.

For large numbers of reliable integrated circuits to be manufactured, the structural and process materials involved must be precisely characterized. In general, this requires pure materials or pure materials that have been altered by the controlled introduction of impurities. While contamination is inevitable, even small amounts can impair the functioning, reliability, and/or lifetime of an integrated circuit. The susceptibility of integrated circuits to impairment by contamination has increased with decreasing feature sizes.

The gate oxide of a MOS transistor is an example of a feature that is highly susceptible to impairment by contamination. A MOS transistor typically comprises active elements including a source, a drain, and a channel. Current between the source and drain is controlled by the conductivity of the channel, which is, in turn, controlled by the voltage differential between the drain and a gate. The gate is a conductive element disposed over the channel and separated from it by the gate oxide. The gate oxide is intended to prevent current flow between the gate and the drain so that the gate-drain voltage required for channel control can be established.

If the gate-drain voltage is excessive, the gate oxide breaks down. When gate break-down occurs, current flows between the gate and drain, in which case, the transistor no longer functions as intended. Even one bad transistor can render useless an entire integrated circuit. The "breakdown" voltage at which such damage can occur depends on the thickness and purity of the gate oxide. As gate oxide thickness has decreased with generally decreasing feature sizes, the purity of the gate oxide (silicon dioxide) has become increasingly important.

Removal of contaminants generally involves dislodging and rinsing contaminants away. Several approaches to dislodging contaminants are available. Surface particles can often be dislodged by mechanically shaking a substrate, for example, using ultrasound. Detergents, such as ammonium hydroxide, can be used to weaken the bonds between particles impair the functioning, reliability, and/or lifetime of an integrated circuit. The susceptibility of integrated circuits to impairment by contamination has increased with decreasing feature sizes.

For contaminants held fast in a silicon surface, an oxidizing agent can be used to convert silicon to silicon dioxide. An etchant, such as hydrogen fluoride, that etches silicon dioxide at a much greater rate than silicon can be used to etch the oxide growth; in the process, the entrained contaminants are dislodged from the substrate so that they can be removed in a rinse.

In accordance with these principles, a basic two-solution approach to contamination has been adopted by much of the semiconductor industry. The first solution includes hydrogen peroxide, and ammonium hydroxide in de-ionized water. The ammonium hydroxide acts as a detergent, weakening the bonds between contamination particles and the substrate. The hydrogen peroxide is an oxidizing agent. It oxidizes organic contaminants so that they are water-soluble. It also oxidizes substrate silicon. After a peroxide and ammonium hydroxide treatment, a rinse removes particles and oxidizes organic material.

The second solution is hydrogen fluoride in de-ionized water. The hydrogen fluoride etches exposed silicon dioxide at roughly fifty times the rate it etches silicon. Thus, it removes existing silicon dioxide, including that grown in the presence of the peroxide in the first solution. Thus, the contaminants, entrained originally in the silicon surface and then in the oxide growth, are dislodged from the substrate for removal in a subsequent rinse. If further decontamination is desired, the two-solution treatments can be repeated. A drying step in isopropyl alcohol (IPA) vapor removes the final rinse water. A relatively pure silicon dioxide layer can then be grown or deposited.

The basic two-solution approach can be supplemented and modified in several ways. In some cases, one but not both of the solutions are used. Ozone is sometimes used instead of hydrogen peroxide as the oxiding agent. The bare silicon substrate can be cleaned ultrasonically before the basic two-solution approach is used. The basic approach can be preceded by a sulphuric acid treatment, for example, to remove remnants of photoresist. Various cheating agents, such as chloracetic acid and ethlenediamine-tetra-acetic acid (EDTA) that bind metal, or other chemical agents can be added to either solution to reduce the likelihood of recontamination by dislodged contaminants.

The various cleaning chemistries can be used alone or in sequence with others. Hydrogen fluoride is often a preferred last step because hydrogen fluoride can be obtained with relatively high purity, and the resulting surface is well suited for oxidization, chemical vapor deposition, and pre-metallization processes. In the course of its manufacture, a single integrated circuit can be subjected to more than ten cleaning steps; many of these can be variations of those described above. Despite the success of the cleaning chemistries developed to date, improved cleaning chemistries are desired to improve today's yields and reliability, and to permit even smaller devices in the future.

SUMMARY OF THE INVENTION

In accordance with the present invention, an integrated circuit in the process of manufacture can be treated with an aqueous solution of hydrogen fluoride and nitric acid. This solution can be used to remove contaminated silicon dioxide so that it can be replaced by a relatively contamination free oxide formation. The replacement oxide can be a growth or a deposition.

The method preferably begins with treatment of the integrated circuit with an aqueous hydrogen peroxide solution. The peroxide can oxide organic contaminants so as to increase their solubility. In addition, the peroxide oxides surface silicon so that entrained contaminants are removed when the oxide growth is etched. Ozone can be used as an alternative oxidant.

Preferably, the peroxide solution also contains ammonium hydroxide or other detergent to weaken bonds between contaminants and the integrated circuit. In addition, chemical and other chemical agents can be used to prevent dislodged contaminants from re-contaminating the substrate. Thus, an aqueous rinse can effectively remove contaminants. Alternatively, the method can begin without the peroxide treatment.

In the aqueous hydrogen fluoride and nitric acid solution, the hydrogen fluoride etches away existing oxide, leaving remaining oxide or a bare silicon substrate. The nitric acid combines with calcium to yield calcium nitride, which is highly soluble in water. Thus, calcium contaminants are effectively removed in a subsequent rinse step. In addition, the nitric acid also combines with various metal contaminants so that they can be rinsed away more readily.

Nitric acid is used in silicon etching, and thus is considered an unlikely candidate for as a component in an etch intended to remove oxide while preserving silicon. Apparently, in combination with hydrogen fluoride and at the relatively low preferred concentrations, the presence of nitric acid does not significantly increase the silicon etch rate of the hydrogen fluoride bath. Surprisingly, some tests have shown that at some concentrations, the presence of nitric acid lowers the silicon etch relative to that of hydrogen fluoride without nitric acid. For example, a 10:1:4 solution etches silicon dioxide faster and silicon more slowly than a 10:1:0 solution (water:hydrogen fluoride:nitric acid, by weight) More generally, the nitric acid can be in ratios 20:1 to 2:1, preferably, 10:1 to 3:1, as long as the hydrogen fluoride concentration is in the range of water:hydrogen fluoride 20:1 to 5:1.

After the aqueous hydrogen fluoride and nitric acid treatment, an aqueous rinse removes the etch products and freed contaminants. A drying step is used to remove rinse water. Finally, a replacement oxide is formed. This formation may involve growth of oxide, e.g., pad, sacrificial, gate, or deposition of an oxide, for example, a TEOS deposition of submetal dielectric. The result is a relatively contamination-free oxide. In the case of the gate oxide, for example, the resulting dielectric has a higher breakdown threshold—providing for a more reliable device. These and other features and advantages of the present invention are apparent from the description below with reference to the following drawings.

DESCRIPTION OF THE PREFERRED EMBODIMENTS

Figure 1:
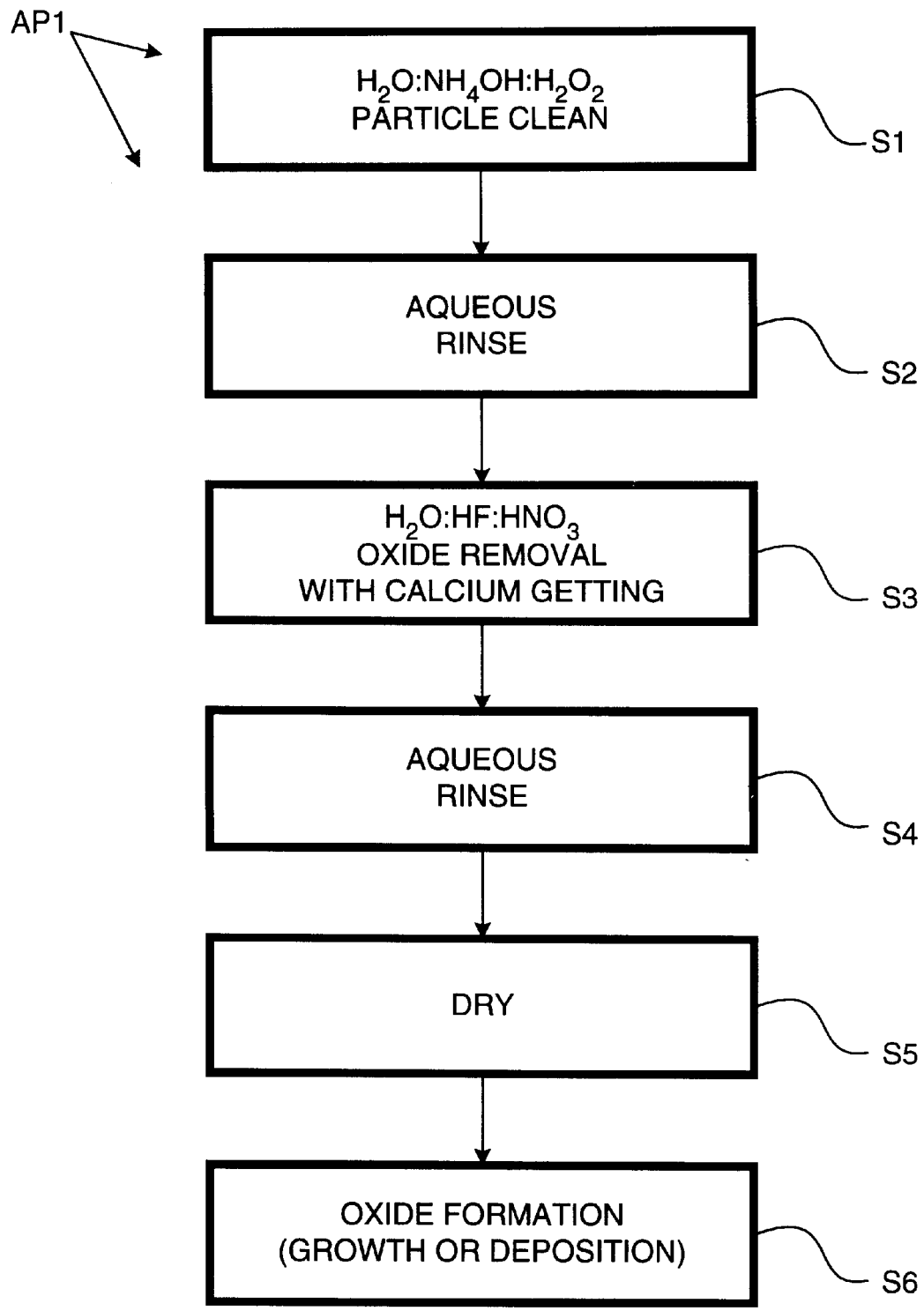
FIG. 1 is a flow chart of a method in accordance with the present invention.

In accordance with the present invention, a method AP1 for use in the manufacture of integrated circuits comprises a step S1 of removing particles and organic material from a partially manufactured integrated circuit using a solution of hydrogen peroxide and ammonium hydroxide in water, an aqueous rinse step S2, a step S3 of removing oxide and calcium using an aqueous solution of hydrogen fluoride and nitric acid, an aqueous rinse step S4, a step S5 of drying the silicon surface, and a step S6 of forming an oxide on the silicon surface, as flow charted in FIG. 1. Depending on the stage of manufacture, the oxide formation can involve either growth or deposition of silicon dioxide. The oxide formed in accordance with method AP1 exhibits relative freedom from contamination and extended lifetime performance.

Figure 2:
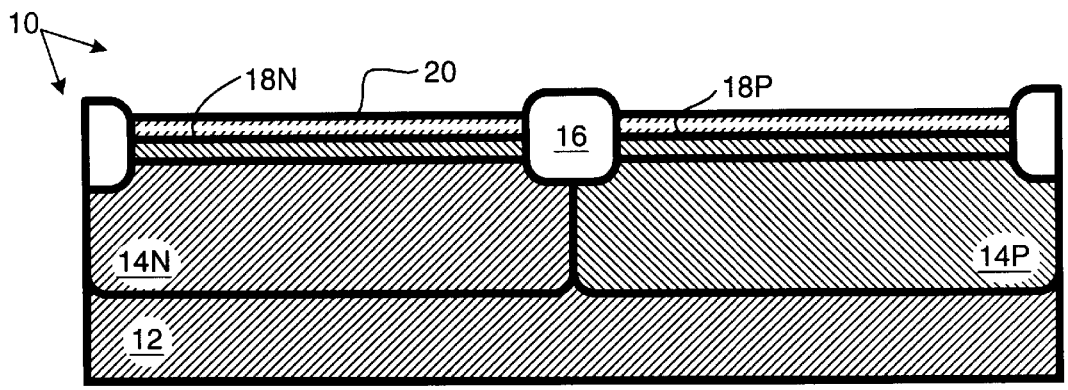
FIGS. 2–8 are sectional views of an integrated circuit at successive stages of manufacture in accordance with the method of FIG. 1.

While method AP1 is preferably used at several appropriate points in the manufacture of a CMOS integrated circuit, it is particularly valuable as a method of forming a gate oxide beginning with the structure shown in FIG. 2. FIG. 2 presents a view of a partially manufactured integrated circuit 10, including an initially p-type monocrystalline silicon substrate 12. Certain regions of substrate 12 have been doped to alter its electrically properties. In particular, n-type dopant has been implanted to define an n-well 14P which is the site for a PMOS transistor; p-type dopant has been implanted to define a p-well 14N, which is the site for an NMOS transistor. NMOS and PMOS transistors are the "complementary" components of CMOS ("complementary metal-oxide-silicon") integrated circuits.

A field oxide 16 is grown to help electrically isolate the transistor sites of integrated circuit 10. To define shallow adjusted threshold regions 18N and 18P, n-type dopant has been implanted through a sacrificial oxide 20 (silicon dioxide layer). In part because it has been penetrated by dopant, sacrificial oxide 20 is too contaminated to serve as a suitable gate oxide. The impurities would lower the breakdown voltage of the gate, reducing the manufacturability and reliability of the integrated circuit.

Accordingly, method AP1 is used to replace sacrificial oxide 20 with the actual gate oxide. At step S1, an aqueous five-minute bath of ammonium hydroxide and hydrogen peroxide is applied. The hydrogen peroxide oxidizes any organic material that, for example, may remain from photoresist, so that it is easier to remove. The ammonium hydroxide weakens metal particle bonds to the substrate so that these are more easily removed. Step S2 is a rinse to remove the freed metal particles and the oxidized organic matter.

Figure 3:
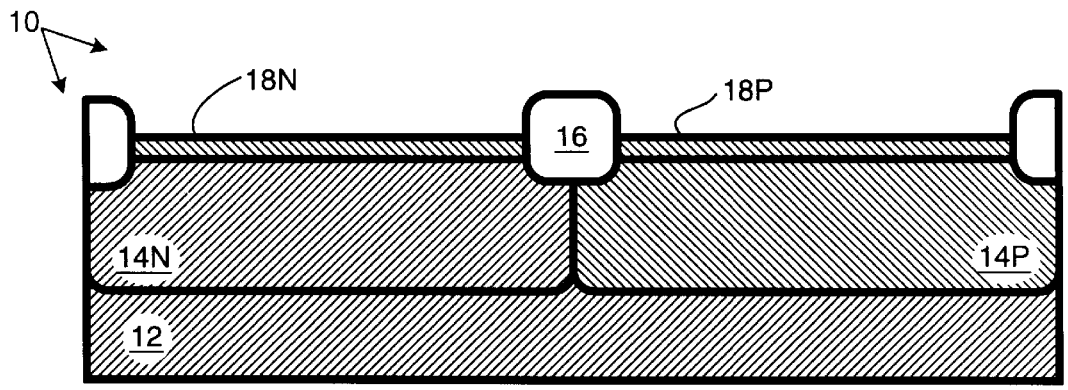

Step S3 is the aqueous bath of hydrogen fluoride and nitric acid. Preferably, treatment is for five minutes and the water:hydrogen fluoride:nitric acid ratio is 10:1:4 by weight. The hydrogen fluoride selectively etches silicon dioxide relative to silicon. Although nitric acid is used in silicon etches, in solution with hydrogen fluoride and at the preferred concentrations below 10:5 water:nitric acid by weight, silicon etching is not significantly increased by the presence of nitric acid. The nitric acid does interact with metals and calcium to form water soluble products. In particular, the water solubility of calcium nitride is relatively high. Thus, calcium released as the sacrificial oxide is etched is converted to water soluble form so that it is less prone to recontaminate the substrate. In step S4, an aqueous rinse removes the etching and nitride products. Step S5 involves drying the substrate in isopropyl alcohol (IPA) vapor. The resulting structure is shown in FIG. 3.

Figure 4:
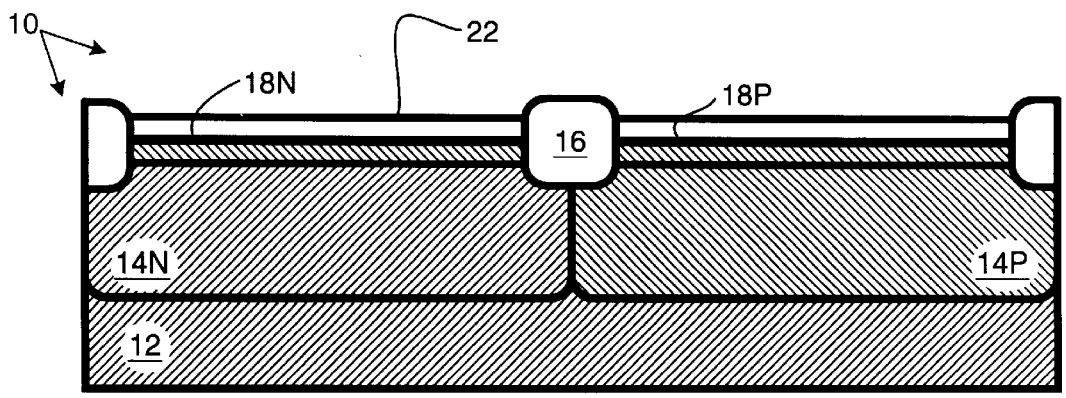

Step S6 involves the thermal growth of gate oxide 22, shown in FIG. 4. Because of the makeup of the step S3 solution, gate oxide 22 is relatively free of metal and calcium impurities. This contributes to excellent predicted device lifetimes.

Figure 5:
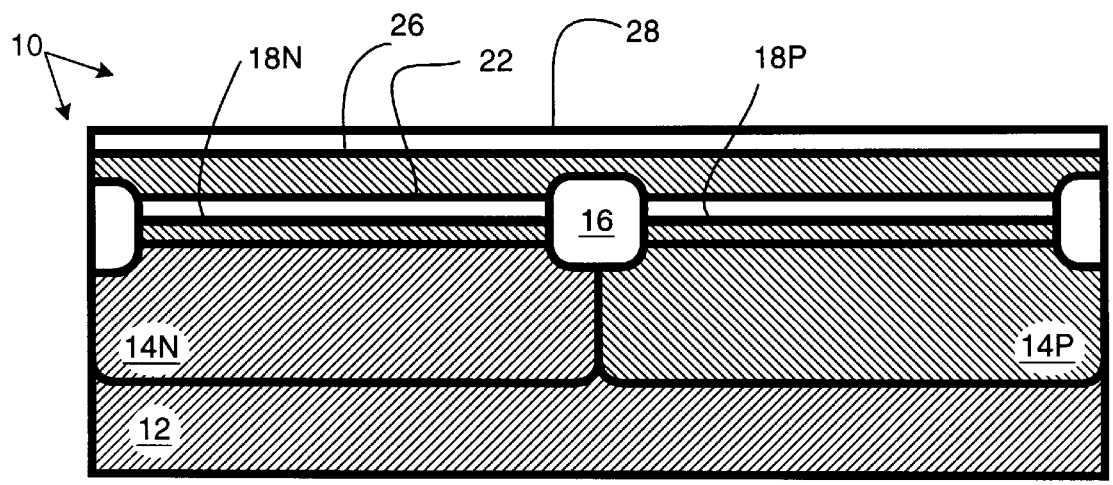

After gate oxide 22 is grown, polysilicon 24 is deposited, as shown in FIG. 5. Steps S1 through S5 of method AP1 are applied to remove contamination on the polysilicon so that contaminants are not driven in during the next implant step. Dopant is implanted into polysilicon 24 to enhance its conductivity. After the implant, a double clean procedure is applied to remove contaminants. The double clean has the sequence S1-S2-S3-S4-S4-S5. The double pre-clean prepares for a silicide formation step to further enhance conductivity of the polysilicon. Method AP1 is then used, culminating in a TEOS oxide deposition 26 to protect the silicide, resulting in the structure of FIG. 5.

Figure 6:
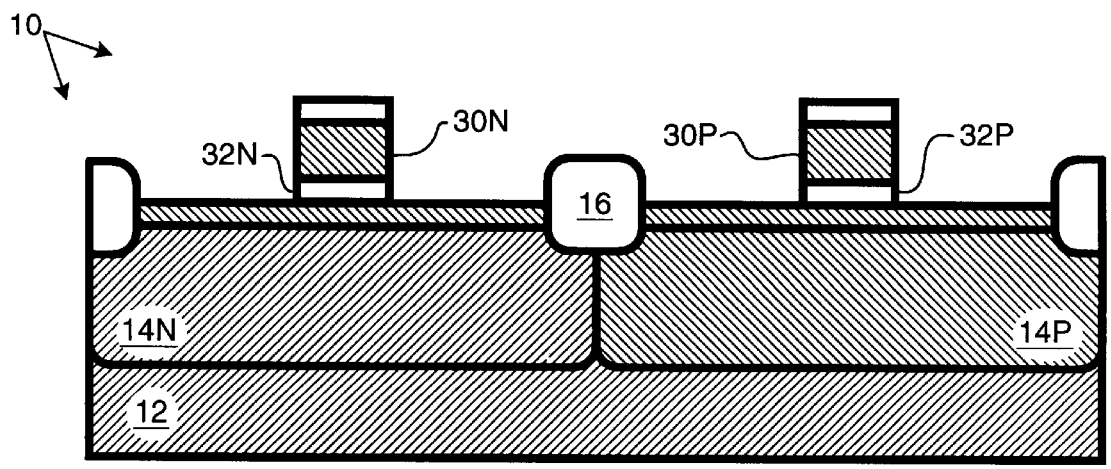

Photoresist is applied on the structure of FIG. 5, and a gate pattern is defined in the photoresist. An etch is applied through oxide 26 and polysilicon 24 to define local interconnects and gates 30N and 30P as well as gate oxides 32N and 32P. The resulting structure is depicted in FIG. 6. The resist is striped. Steps S1–S6 are applied to leave a passivation layer. The structure of FIG. 6 is then annealed.

Figure 7:
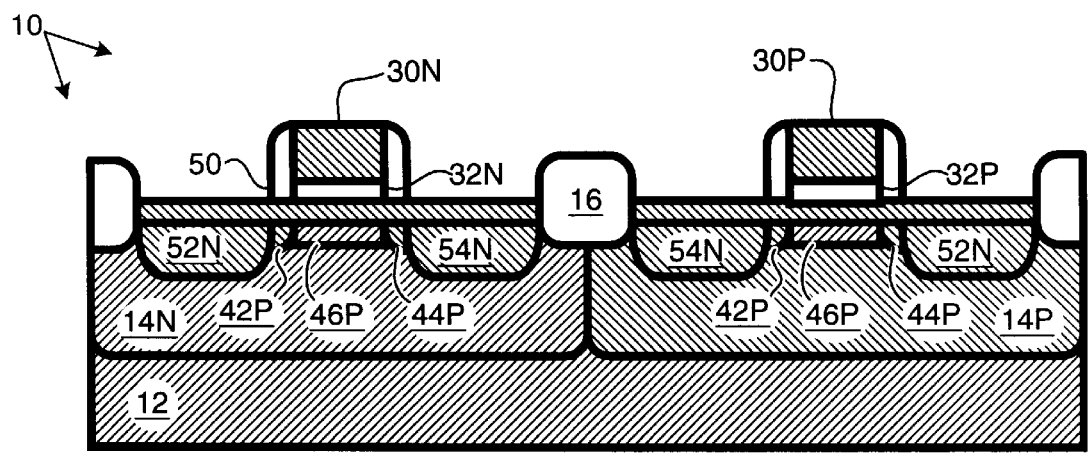

Photoresist is applied and patterned to protect n-wells and expose p-wells. A light shallow n-type NMOS LDD implant provides the doping for lightly doped source and drain regions 42N and 44N of the NMOS transistors, as shown in FIG. 7. The substrate region masked by NMOS gate 30N during the NMOS LDD implant is NMOS channel 46N. The resist is stripped, and another photoresist is applied and patterned to protect p-wells and leave n-wells exposed. A light shallow p-type PMOS LDD implant provides the doping for the lightly doped source and drain regions 42P and 44P of the PMOS transistors. Concomitantly, the masking by PMOS gate 30P during the PMOS LDD implant defines PMOS channel 46P.

The resist is stripped and cleaning steps S1–S5 are executed. Step S6 is executed in the form of a TEOS deposition. An anisotropic etch exposes substrate silicon 12, while leaving sidewalls 50 on polysilicon gate, as shown in FIG. 7. Method AP1 is applied, with step S6 executed in the form of a pad oxide growth to a thickness of about 200 Å. Photoresist is applied and patterned to protect n-wells during a relatively deep and heavy n-type source/drain implant to define NMOS sources and drains 52N and 54N. The photoresist is stripped. Another photolithographic sequence prepares for an ESD implant to improve resistance to damage due to electrostatic discharge.

Method AP1 is applied to yield a clean structure passivated with a pad oxide. Photoresist is applied and patterned to protect p-wells during a relatively deep and heavy p-type source/drain implant to define PMOS sources and drains 52P and 54P. The photoresist is stripped. An anneal is performed, repairing structural damage caused by the implants. A driven-in diffuses the source and drain dopants to the desired extent.

Figure 8:
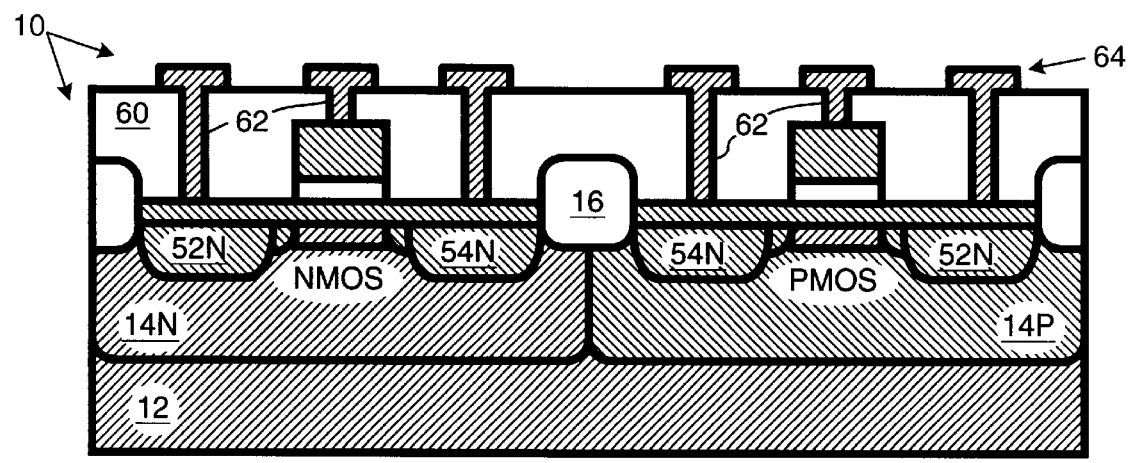

Method AP1 is applied, with step S6 involving a TEOS oxide deposition. Method AP1 is applied to clean the deposited oxide layer. Borophosphate silica glass (BPSG) is applied, and another pre-clean sequence AP1 is implemented. Then the BPSG is reflowed to provide a smoother topology as a foundation for subsequent layers. After another clean procedure AP1. The TEOS and BPSG collectively constitute a submetal dielectric 60, shown in FIG. 8. Apertures are photolithographically defined through submetal dielectric 60 to expose polysilicon gates and local interconnects. Another clean procedure AP1 is implemented.

Metal is deposited, forming contacts 62 through the submetal dielectric apertures. Metal on the upper surface of the submetal dielectric is photolithographically patterned to define a first metal interconnect pattern 64. This results in the structure of FIG. 8.

Inter-metal dielectric, including a TEOS-organic glass-TEOS sandwich is deposited, with method APi applied before and after each oxide formation. Apertures are formed therethrough to expose first level metal lines. Metal is deposited, forming vias to the first metal layer and a second metal layer. The second metal layer is patterned to define a second metal interconnect layer. Additional dielectric and metal layers can be used to define additional metal interconnect and intermetal dielectric layers. The top metal layer is passivated with a sublayer of silicon dioxide covered by a sublayer of silicon nitride. This completes the manufacture of the integrated circuit.

Method AP1 is also applied before the structure of FIG. 2 is complete. Manufacture of integrated circuit 10 begins with substrate 12 of crystalline silicon which is doped p-type to a resistance of about 6 to 9 ohms/centimeter ($\Omega$/cm). Substrate 12 is cleaned ultrasonically, and then method AP1 is used to grow a buffer oxide of about 400 Å. Silicon nitride is deposited to form a layer about 1000 Å thick. The silicon nitride is photolithographically patterned to expose n-well regions. An n-well implant is performed, and the remaining resist is stripped.

Method AP1 is performed, with step S6 involving the growth, of a blocking oxide to a thickness of about 1900 Å to cover n-wells 14P. A wet strip is used to remove the remaining nitride from over the p-well regions. A p-well implant is then performed through the buffer oxide. Method AP1 is applied, leaving a 100 Å pad oxide. A well drive step diffuses the p-well and n-well implants to their desired distributions. Method AP1 is applied to clean dopants diffused to the substrate surface. A wet strip removes the contaminated blocking and buffer oxides. A pad oxide is grown to about 250 Å.

Silicon nitride is deposited to a thickness of 1600 Å. The nitride is photolithographically patterned to expose field oxide regions. Borofluoride ($BF_2$) is implanted in the field regions to enhance the resistance of the field oxide to voltage breakdown. Method AP1 is applied, with step S6 involving growth of field oxide 16. A wet strip with phosphoric acid is used to remove the remaining mask nitride. Method AP1 is applied, in part, to getter the phosphoric acid. In this case, step S6 involves the growth of sacrificial oxide 20. The $V_t$ adjust implant is made through sacrificial oxide, resulting in the structure of FIG. 2.

Tests were performed on test wafers using four concentrations of nitiric acid in aqueous hydrogen fluoride solution: 10:1:0 (control), 10:1:1, 10:1:2, and 10:1:4, wafer to hydrogen fluoride to nitric acid. Lifetime improvements relative to controls ranged from 5% to 82%. With the preferred 10:1:4 solution, lifetime improvements ranged from 124% to 136%. Oxide etch rates were all within 10% of the control, with the preferred solution were about 4 Å/min faster than the control solution. None of the nitric acid solutions significantly increased the silicon etch rate. Surprisingly, the preferred solution slightly decreased the silicon etch rate from 6 Å/min to 5 Å/min.

The present invention provides alternatives to the preferred embodiments. Clearly, the concentration of nitric acid can be varied. The concentration of hydrogen fluoride can be varied as well. However, experience favors values between 100:1 and 5:1, usually 10:1, have been used. Other components can be added to the solution, including cheating agents to help remove metal contaminants. In general, the method culminates in an oxide formation. However, oxide formation can be preceded by another step, such as silicide formation.

The hydrogen fluoride and nitric acid solution can be preceded by various solutions. The preference is for aqueous hydrogen peroxide and ammonium hydroxide. Ozone can be used instead of peroxide. Sulphuric acid solutions can be used instead of or in addition to the preferred ammonium hydroxide solution. A non-aqueous rinse, e.g., IPA, can be used. These and other variations upon and modifications to are provided by the present invention, the scope of which is defined only by the following claims.

What is claimed is:

1. In the manufacture of integrated circuits, a method comprising the steps of:
   a) cleaning a surface of a partially manufactured integrated circuit with a first aqueous solution including hydrogen peroxide;
   b) removing silicon dioxide from over silicon by cleaning said surface with a second aqueous solution of hydrogen fluoride and nitric acid so as to leave some thickness of silicon dioxide over said silicon;
   c) rinsing said surface with a rinse fluid;
   d) drying said surface; and
   e) forming additional silicon dioxide over said silicon.

2. A method as recited in claim 1 wherein step (c) involves depositing an oxide layer.

3. A method as recited in claim 1 wherein step e involves growing oxide.

4. A method as recited in claim 1 wherein step e involves growing a gate oxide.

5. A method as recited in claim 1, wherein step (e) includes drying said surface in alcohol vapor.

6. A method as recited in claim 1, further comprising the steps of:
   f) forming a polysilicon layer over the additional silicon oxide; and
   g) repeating steps (a)–(d), therein removing any contaminants found on the polysilicon layer.

7. A method as recited in claim 1, wherein said first aqueous solution also includes a sulfuric acid solution.

8. A method as recited in claim 1 wherein said first aqueous solution also includes ammonium hydroxide.

9. A method as recited in claim 8, wherein said first aqueous solution also includes a sulfuric acid solution.

10. A method as recited in claim 1 wherein said second aqueous solution has a water-to-nitric-acid ratio between 20:1 and 2:1 and a water-to-hydrogen-fluoride ratio between 20:1 and 5:1.

11. A method as recited in claim 10 wherein said water-to-acid ratio is between 10:1 and 3:1.

12. In the manufacture of integrated circuits, a method comprising the steps of:
    a) cleaning a surface of a partially manufactured integrated circuit with a first aqueous solution including ozone;
    b) removing silicon dioxide from over silicon by cleaning said surface with a second aqueous solution of hydrogen fluoride and nitric acid so as to leave some thickness of silicon dioxide over said silicon;
    c) rinsing said surface;
    d) drying said surface; and
    e) forming additional silicon dioxide over said silicon.

13. A method as recited in claim 12, wherein step (c) includes a non-aqueous rinse of isopropyl alcohol.

* * * * *